United States Patent [19]

Adam

[11] 4,196,441
[45] Apr. 1, 1980

[54] SEMICONDUCTOR STORAGE CELL

[75] Inventor: Fritz G. Adam, Freiburg, Fed. Rep. of Germany

[73] Assignee: ITT Industries, Inc., New York, N.Y.

[21] Appl. No.: 903,359

[22] Filed: May 5, 1978

[30] Foreign Application Priority Data

May 26, 1977 [DE] Fed. Rep. of Germany ....... 2723738

[51] Int. Cl.² ............................................. H01L 27/02
[52] U.S. Cl. ....................................... 357/41; 357/23; 357/45; 357/54
[58] Field of Search ............................ 357/23, 41, 54

[56] References Cited

U.S. PATENT DOCUMENTS

| 3,836,894 | 9/1974 | Cricchi | 357/54 |
| 4,063,267 | 12/1977 | Hsia | 357/54 |

Primary Examiner—Edward J. Wojciechowicz
Attorney, Agent, or Firm—John T. O'Halloran; Peter C. Van Der Sluys

[57] ABSTRACT

A programmable nonvolatile FET storage cell comprising crosswise to the ribbonlike source region as well as to the drain region a ribbonlike reading electrode and a separate ribbonlike writing electrode. Both electrodes are disposed upon a gate insulator layer into which a storage medium is embedded which is common to both electrodes.

35 Claims, 10 Drawing Figures

SEMICONDUCTOR STORAGE CELL

Programmable nonvolatile semiconductor storage cells are known in the English language literature under various designations which refer to the different methods of manufacture or to the mode of operation, such as M I2 I12 = metal-insulator 2-insulator 1-semiconductor MNOS = metal-nitride-oxide-silicon cf. "Siemens Forschungs- and Entwickelberichte," Vol. 4 (1975), No. 4, pp. 213 to 219, MAOS = metal—$Al_2O_3$—$SiO_2$-silicon DDC = dual-dielectric charge-storage cf. "The Bell System Technical Journal," (November, 1974), pp. 1723 to 1770, FAMOS = floating gate with avalanche injection cf. "Solid-State Electronics" (1974), Vol. 17, pp. 517 to 529, RePROM = reprogrammable read only memory EAROM = electrically alterable read only memory Read mostly memory.

The basis structure common to all these storage cells is a self-blocking MIS transistor whose gate dielectric or gate insulator layer I is divided into two partial layers I2, I1. In a storage medium Gm disposed between these two partial layers, an electric charge can be stored. This charge is transported from the semiconductor substrate to the storage medium or vice versa in the form of a quantum mechanical tunnelling current when a sufficiently large voltage pulse is applied to the gate electrode, thereby setting up a sufficiently high field in the partial insulator layer I1 between the semiconductor substrate surface and the storage medium.

This operation is called "writing" if charges equal in sign to the charges of the majority carriers are transported from the source and drain regions to the storage medium. In that case, in the memories known so far, the voltage pulse at the gate electrode has the same polarity as that which results in the channel being opened; for "writing," however, it requires a considerably higher voltage value (typically 30 V) than is necessary during normal operation of a corresponding MIS field effect transistor.

The charge storage after a write pulse of suitable duration increases the threshold voltage $U_T$ of the storage transistor to the point that the latter remains cut off with normal read voltage applied to the gate electrode.

The erasure of the stored information, i.e., the removal of the stored charge from the storage medium, is effected by means of a corresponding voltage pulse of reverse polarity or—like in some FAMOS RePROMs—by illumination with ultraviolet light.

In FAMOS structures, the storage medium is a metal or poly-silicon layer embedded between the partial insulator layer I1 and the partial insulator layer I2. In all other structures, the storage medium is realized by rechargeable electron terms (electron or hole traps) located in or near the interface between I1 and I2. In DDC structures, the traps are vapour-deposited in the form of metal atoms on the partial insulator layer I1 prior to the deposition of the partial insulator layer I2.

In the case of all-electrically programmable nonvolatile memories, the development is aimed at achieving minimum write and erase times with a moderate programming voltage value and at a maximum retention time. The ideal goal is a nonvolatile MIS RAM (random access memory).

It has turned out, however, that compromises must be made between these requirements, and that with the storage transistor structures used so far, certain limit values cannot be exceeded.

The object of the invention is to largely render the quantities "programming voltage," programming-pulse duration," and "retention time," which are subject to such contradictory requirements, independent of one another so as to considerably extend the range of the limit values determined by the contradictory requirements.

The invention relates to a semiconductor cell as set forth in the preamble of claim 1.

According to the invention, the above object is achieved by the structure given in the characterizing part of claim 1.

The semiconductor storage cell thus consists essentially of two parallel-connected storage transistors with common source region and common drain region but with separate gate electrodes, one of which, hereinafter referred to as "programming gate Gp," is used for writing, while the other, hereinafter referred to as "readgate Gr," is used for reading. The semiconductor storage cell according to the invention may therefore be called a "storage tetrode." An essential feature of the semiconductor storage cell according to the invention is a storage medium Gm which is common to both parallel-connected transistors and may be a layer of metal or polycrystalline silicon or of another semiconductor metal embedded in the gate insulator layer. The storage medium may also be an artificially introduced layer of discrete electron or hole traps which are so dense as to be quasi-conductively connected through the tunnel effect.

According to the invention, the thickness of the outer partial layer I2 below the programming gate Gp is made larger than than of the outer partial layer I3 below the read gate Gr. Thus, with a programming voltage equal to or even lower than that used so far, it will be possible to generate higher field strengths in the partial layer I1 or in the partial layer I2 of the gate insulator layer below the programming gate Gp. This makes possible short write and erase pulses. The reduction of the pulse width necessary for the same final state of the recharging of the storage medium is disproportionate to the layer thickness reduction since the tunnelling currents vary exponentially with the field strength in the gate insulator layer. This is the case although the capacitance of the storage medium Gm is greater because the medium extends into the parallel transistor.

This holds true even if the thin partial layer I1 of the gate insulator layer between the silicon surface and the storage medium Gm is made considerably thicker than in conventional M I2 I1S storage transistors, i.e., 40 to 100 Å instead of 20 to 30 Å. Through the thicker partial layer I1, a considerable reduction of back-tunnelling and, thus, a longer retention time are achieved.

The influence of the charge Qm in the storage medium Gm on the threshold voltage $U_T$ of the read gate, $$\Delta U_T = (\Delta Q_m / C_{ox}) = (Q_m \cdot d_3)/(\epsilon_0 \cdot \epsilon),$$

where $C_{ox}$ = oxide capacitance, $d_3$ = oxide layer thickness, and $\epsilon_0 \cdot \epsilon$ = dielectric constant of the oxide layer, is maintained on the level found in known storage cells. It can even be increased, because the layer thickness $d_3$ can be chosen to be as large as in known storage cells and even larger.

The invention with its features and advantages will now be explained with reference to the accompanying drawings, in which.

Figure 9:
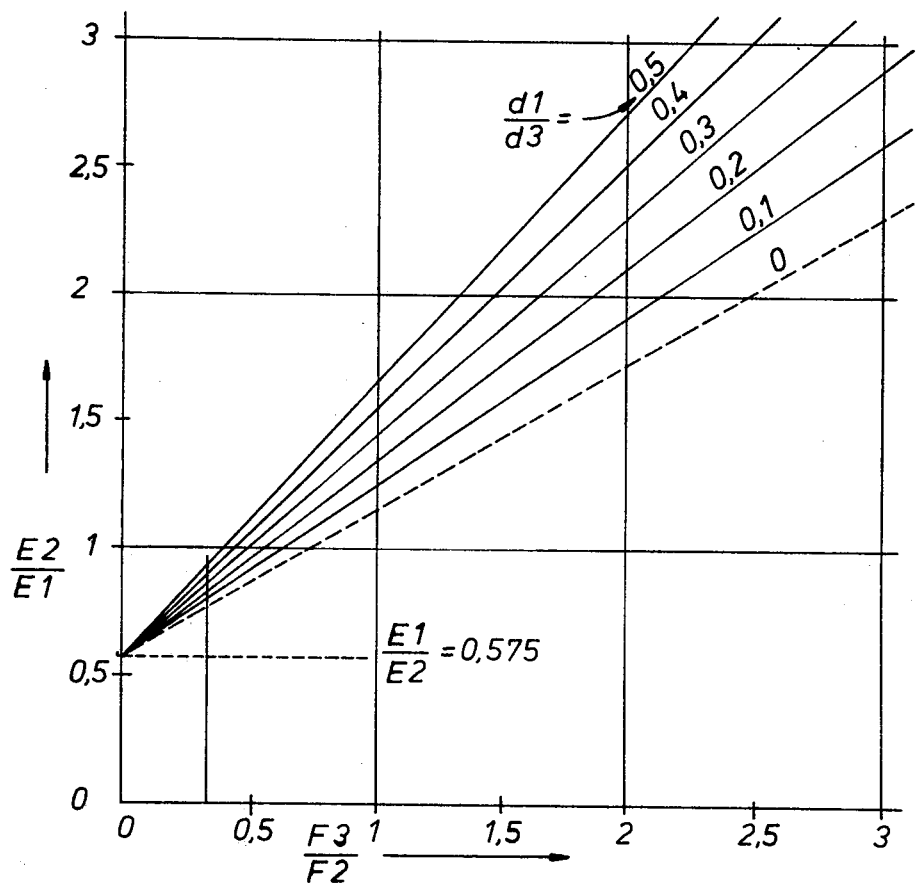
Figure 10:
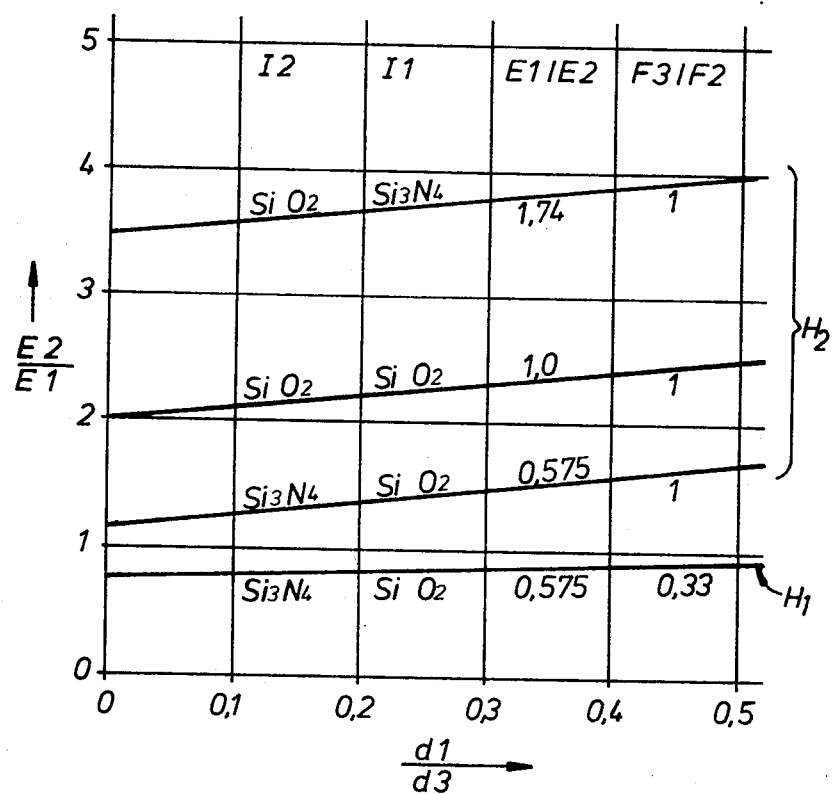

FIG. 9 is a graphical representation of the ratio of the field strengths in the gate insulator layers I2 and I1 as a function of the area ratios of the gate insulator layers I3 and I2 for different thickness ratios of the gate insulator layers I1 and I3, and FIG. 10 serves to illustrate the ratios of the field strengths E2 and E1 for three different gate insulator layer structures as a function of the ratios of the layer thicknesses $d_1$ and $d_3$.

Figure 1:
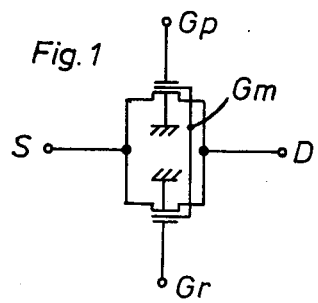
FIG. 1 is a basic circuit diagram of the storage cell according to the invention.
Figure 2:
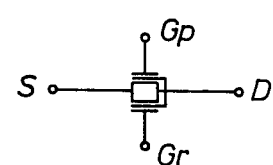
FIG. 2 is a simplified representation of the basic circuit of FIG. 1 without substrate terminals.
Figure 3:
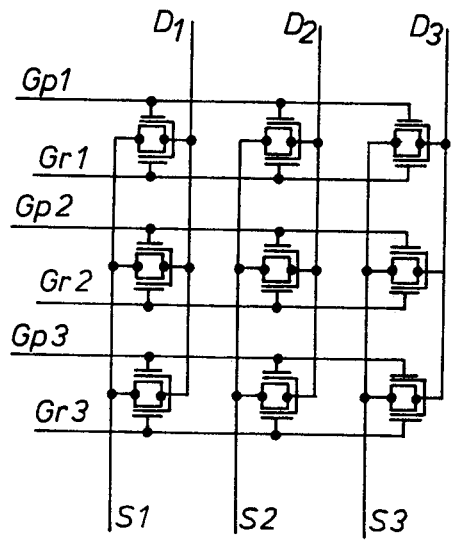
FIG. 3 shows a 3×3 storage matrix using the basic circuit of FIG. 2.

The basic circuit of FIG. 1 and its simplified representation of FIG. 2 derive from the above-mentioned fact that the storage cell according to the invention must be regarded as two field-effect storage transistors connected in parallel and having a common source region, a common drain region, and a common, continuous storage medium Gr, but with separate gates Gp and Gr. Accordingly, a 3×3 storage matrix can be represented in the form of a circuit diagram as shown in FIG. 3. In this circuit diagram, the programming gates Gp and the read gates Gr are interconnected rowwise, while the sources and drains are interconnected columnwise.

Figure 4:
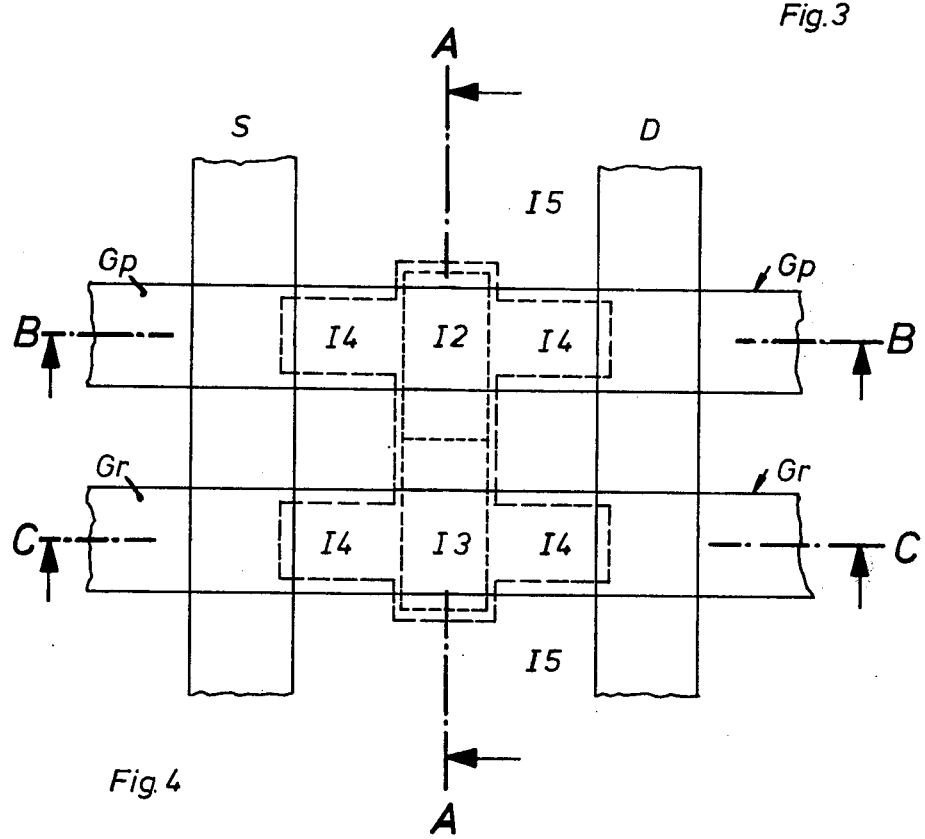
FIG. 4 is a top view showing the topological structure of a storage cell according to the invention.
Figure 5:
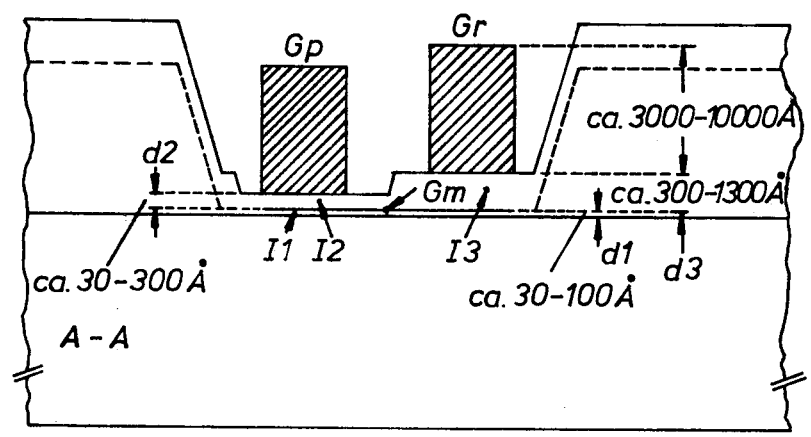
FIGS. 5, 6 and 7 are sections taken, respectively, along lines A—A, B—B, and C—C of FIG. 4.
Figure 6:
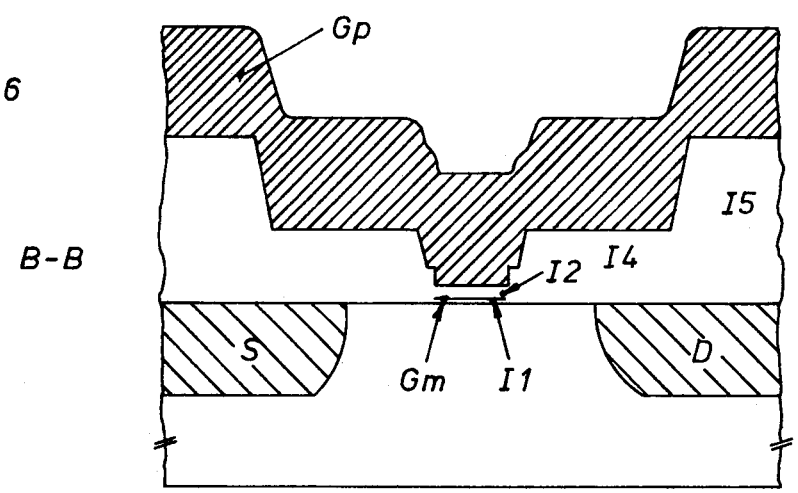
Figure 7:
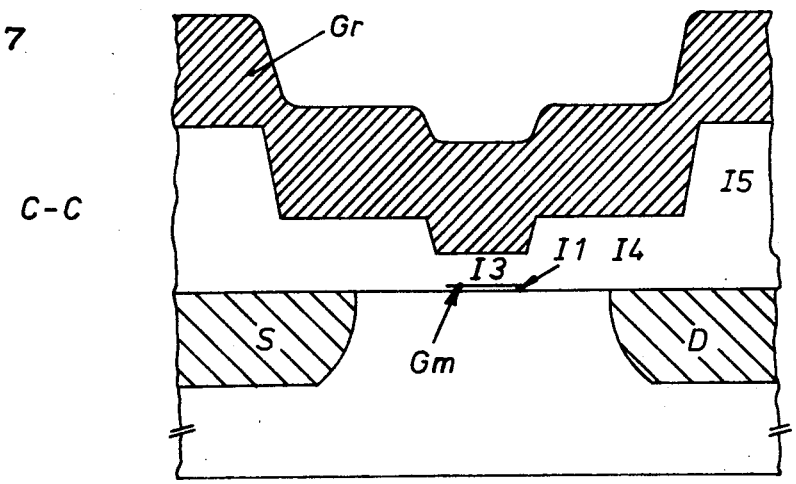

FIG. 4 illustrates the topological structure of a semiconductor storage cell according to the invention in a top view. The diffused source region and the diffused drain region extend perpendicular to the gate current paths of metal or polycrystalline silicon which contain the programming gate Gp and the read gate Gr of each of the semiconductor storage cells of a row. Shown in broken outline are the areas I1 and I4, which define the two channels below the gates Gp and Gr. Disposed outside the areas I1 to I4 is the thicker field oxide layer I5. The channels below the two gates between the common source region S and the common drain region D are divided into two subregions by means of the partial layer I4, which, as shown in FIGS. 6 and 7, is thicker than those portions of the gate insulator layer made up of the partial layers I1 and I2. As shown in FIG. 5, the continuous storage medium Gm extends below and between the two electrodes Gp and Gr and is embedded between the inner partial layer I1 adjoining the silicon surface and the two outer partial layer I2 and I3.

The central areas of the gate insulator layer, with the partial layers I1 and I2 below the programming gate Gp and with the partial layers I2 and I1 below the read gate Gr, adjoin each other, as shown in FIG. 4, so the two central portions of the channel region, which do not border on the source and drain regions, are interconnected. This gives a channel region which has essentially the shape of a Latin "H" whose transverse bar corresponds to the extension of the central portion of the channel region with the embedded storage medium Gm, and whose two legs extend below the programming gate Gp and the read gate Gr.

The thickness $d_3$ of the partial layer I3 of the gate insulator layer can lie in the range between the thickness $d_2$ of the partial layer I2 below the programming gate Gp and the thickness $d_4$ of the partial layer I4 adjoining the source region S and the drain region D.

The embodiment shown in FIGS. 5 to 7 uses for the partial layer I1 disposed between the storage medium Gm and the semiconductor surface a uniform thickness $d_1$ in the range between 30 and 300 Å, as is shown in FIG. 5, but the other partial layers I2 and I3 lying below the gates have so different thicknesses $d_2$ and $d_3$ that the gate insulator layer covering the partial regions of the channel varies in thickness. The thickness $d_2$ of the partial layer I2 is smaller than the thickness $d_3$ of the partial layer I3. The thickness $d_2$ of the partial layer I2 below the programming gate Gp is in the range between 30 and 400 Å, while the partial layer I3 between the storage medium Gm and the read gate Gr has a thickness $d_3$ in the range between 400 and 2000 Å.

To ensure easy manufacture, the partial layer I1 between the storage medium Gm and the semiconductor surface is made of a uniform dielectric material. It may be made of a material having a smaller dielectric constant than the material of the partial layer I2 between the storage medium Gm and the programming gate Gp. For instance, the partial layer I1 between the storage medium Gm and the semiconductor surface may be of $SiO_2$, while the partial layer I2 between the storage medium Gm and the programming gate Gp is made of $Al_2O_3$ or $Ta_2O_5$, but preferably of silicon nitride ($Si_2N_4$).

The thinner partial layer I2 may be etched from an uninterrupted layer having the thickness of the partial layer I3.

It is also possible to deposit an uninterrupted nitride layer and etch the partial layers therefrom, as indicated by broken lines in FIG. 5. Instead, use may be made of sequences of $SiO_2$ and $Si_3N_4$ layers. Silicon nitride may also be replaced by aluminum oxide ($Al_2O_3$) or tantalum oxide ($Ta_2O_5$).

It is also possible to dispense with silicon nitride or other insulating materials with high dielectric constant and make all partial layers of $SiO_2$. The partial layers I2 and I3 may also be made of different insulating materials; for example, the partial layer I2 below the programming gate Gp may be of silicon nitride, and the partial layer I3 below the read gate Gr of an oxide.

The programming gate Gp and the read gate Gr may be made of different materials, too, in order to improve the write and erase characteristics or the retention time; for instance, the programming gate Gp may be of a suitably doped polycrystalline silicon, and the read gate Gr of aluminum.

The hitherto known nonvolatile semiconductor storage cells all have a so-called conventional hysteresis, at which, as was mentioned above, a negative programming voltage at the gate drives a positive charge into the storage medium and, thus, changes the threshold voltage $U_T$ in the negative direction; conversely, when the programming voltage is positive, a positive charge is driven to the gates. With this conventional hysteresis, the net charge transport takes place between the storage medium and the silicon surface of the channel region.

In M I2 I1S storage cells, this is achieved primarily by making the field strength in the inner partial layer I1 adjoining the silicon surface higher than that in the outer partial layer I2 by choosing for the two partial layers I2 and I1 insulating materials whose dielectric constants obey the relation $\epsilon 2 > \epsilon 1$, i.e. the material of the outer partial layer I2 has the higher dielectric constant. In practice, the outer partial layer I2 is made of $Si_3N_4$ or $Al_2O_3$ with $(\epsilon 2/\epsilon 0) \approx 6.8$ or 8.5, respectively, while the inner partial layer I1 is made of $SiO_2$ with $(\epsilon 1/\epsilon 0) = 3.9$. In addition, to increase writing and erasing speeds, the inner partial layer I1, made of $SiO_2$, is made so thin that direct tunnelling takes place; this also results in increased back-tunnelling and, consequently, a relatively short retention time, however.

Figure 8:
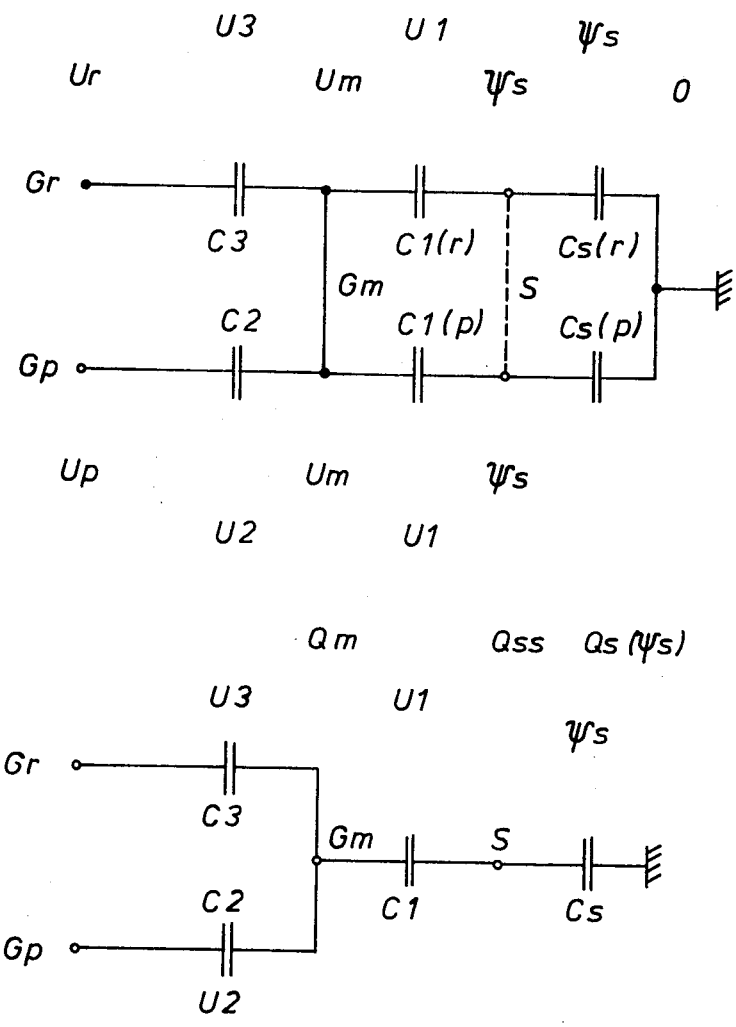
FIG. 8 shows a simplified equivalent circuit diagram of the gate capacitances and the voltages, potentials, and charges used for formulaic analysis.

FIG. 8 shows above an equivalent circuit diagram, and below a simplified equivalent circuit diagram, of the semiconductor storage cell according to the invention. The first line gives the voltages U3, U1, $\psi_s$ occurring between the respective points of the circuit, and the second line the potentials Ur, Um, $\psi_s$, 0. Accordingly, the potentials and voltages along the lower branch of the equivalent circuit diagram are given in the two lines below the upper equivalent circuit diagram. The diagram also contains indications of the stored charge Qm, the charge Qss at the interface between the partial layer I1 and the semiconductor surface, and the charge $Q_2$ ($\psi_s$). Similar indications are given at the simplified circuit diagram shown at the bottom of FIG. 8. In addition, both equivalent circuit diagrams include the designations for the respective equivalent capacitances.

With the aid of the equivalent circuit diagram of FIG. 8 and using known equations, the following relations can be derived.

$$U1 = \frac{UpC2 + UrC3 + Qm - (\phi ms + \psi s) \cdot (C3 + C2)}{C1 + C2 + C3} \quad (1)$$

$$U2 = \frac{Up(C1 + C3) - UrC3 - Qm - (\phi ms + \psi s) \cdot C1}{C1 + C2 + C3} \quad (2)$$

The threshold voltage $U_T^{(r)}$ of the read gate Gr and the threshold voltage $U_T^{(p)}$ of the programming gate Gp are $$U_T^{(r)} = (\phi ms + 2\phi_F) \cdot (1 + \frac{C2}{C3}) - [Qss + Qs(2\phi_F)] \cdot \left[ \frac{1}{C3} + \frac{1}{C1}(1 + \frac{C2}{C3}) \right] - \frac{Qm + UpC2}{C3} \quad (3)$$

$$U_T^{(p)} = (\phi ms + 2\phi_F) \cdot (1 + \frac{C3}{C2}) - [Qss + Qs(2\phi_F)] \cdot \left[ \frac{1}{C2} + \frac{1}{C1}(1 + \frac{C3}{C2}) \right] - \frac{Qm + UrC3}{2} \quad (4)$$

An analysis of the equivalent circuit of the semiconductor storage cell according to the invention, illustrated in FIG. 8, shows that for conventional hysteresis, because of the parasitic capacitance below the read gate, the field strength condition E1 > E2, i.e., field strength in the partial layer I1 higher than that in the partial layer I2, can be satisfied only if the area F2 of the storage medium Gm below the programming gate Gp is made considerably larger than the corresponding area F3 below the read gate Gr.

If silicon nitride is chosen for the upper partial layers I2 and I3, and the required field strengths with uncharged storage medium (Qm=0) are E1 $\geq$ 1.25 × E2, then, for $d_1/d_3 = 0.1$, the areas F2 and F3 must satisfy the conditions F2 $\geq$ 3 F3. This follows from FIG. 9, in which, after a calculation of the field strengths in the gate insulator layer on the basis of the equivalent circuit diagram of FIG. 8, the field-strength ratio E2/E1 was plotted as a function of the area ratio F3/F2, with $d_1/d_3$ as a parameter. It was assumed that the read gate Gr is at substrate potential (Ur=0) during programming, which must be taken into account during the operation of the storage cell.

An area ratio F3/F2 << 1, which is obviously indispensable with conventional hysteresis, means non-optimum area utilization, which would be optimum if F3/F2=1, since both gates or transistors could then be realized in minimum size.

From FIG. 9 it can be seen that F3/F2=1 can be realized only at a field-strength ratio E2/E1 > 1. This, however, involves a change to the "inverse" or "complementary" hysteresis if the tunnel thresholds at the two interfaces of the outer partial layer I2 are of the same height or different in the correct sense, for with complementary hysteresis, the net charge transport takes place between the storage medium Gm and the programming gate Gp.

On closer inspection it can be seen that the semiconductor storage cell according to the invention is especially suited for the complementary hysteresis since the parasitic capacitance of the storage medium Gm below the read gate Gr leads to an increase in the field strength E2 in the outer partial layer I2 below the programming gate Gp, and since this partial layer I2 can be made so thin as is just permitted by the required retention time. This makes possible high field strengths E2 with relatively low gate voltages.

In this connection it is of interest that the field-strength ratio E2/E1 is independent of the thickness d2 of the outer partial layer I2. This follows from the equation:

$$\frac{E2}{E1} = \frac{\epsilon 1}{\epsilon 2} + \frac{F3}{F2} \left( \frac{1}{2} + \frac{d1}{d3} \right), \quad (5)$$

which is obtained from equations 1 and 3 when $$Qm = 0; \phi ms + \psi s << U_p;$$
$$E1 = \frac{U1}{d1}; E2 = \frac{U2}{d2}$$
$$C1 = \frac{\epsilon 1 \cdot F1}{d1} \text{ etc. } \epsilon 3 = \epsilon 2.$$

FIG. 9 shows this field-strength ratio according to equation 5 as a function of the ratio of the area F3 below the read gate to the area F2 below the programming gate.

The threshold voltage $U_T^{(r)}$ of the read gate Gr is influenced by the thickness d2 of the outer partial layer I2 and, consequently, by C2 only slightly, as can be read from equation 3, since the expression with $\phi ms$ and $2\phi_F$ is relatively small, and since C1 >> C3.

The complementary hysteresis can also be realized with a semiconductor storage cell according to the invention whose gate insulator layer is made of only one material, e.g. $SiO_2$, in all partial layers. When $\epsilon 1/\epsilon 2 = 1$, according to equation 5, the field-strength ratio E2/E1 becomes greater than in the case considered so far. The reversal of the hitherto considered sequence of a partial layer of $SiO_2$ and a partial layer of $Si_3N_4$ gives even larger values.

In FIG. 10, the field-strength ratio E2/E1 for the three structures $Si_3N_4$ on $SiO_2$, $SiO_2$ on $SiO_2$, and $SiO_2$ on $Si_3N_4$ is plotted as a function of the layer-thickness ratio $d_1/d_3$ for $F3/F2=1$, with $Q_m=0$. For the first structure, the case $F3/F2=0.33$ for conventional hysteresis (H1) is shown, too. The third structure, which provides the highest field-strength ratio $E2/E1$, is preferably realized in the semiconductor storage cell according to the invention by using silicon nitride only below the programming gate Gp for the inner partial layer I1, while $SiO_2$ is used below the read gate because of its better interface properties. Below the programming gate Gp, the higher surface state density of the silicon nitride-silicon interface can be tolerated without damage. The field-strength ratios with complementary hysteresis are designated in FIG. 10 by H2.

From FIG. 9 it can be seen that the field-strength ratio $E2/E1$ can be increased much further if the optimum area ratio 1 is abandoned and the ratio $F3/F2$ is increased by 2, for example. In the layer structures for complementary hysteresis, the storage medium Gm and the programming gate Gp are preferably made of one and the same material, e.g. of $n^+$-polysilicon, magnesium, manganese, titanium, i.e., materials with relatively low work function.

Each of the three above-mentioned structures for complementary hysteresis has its advantages and disadvantages. These are contrasted with one another in the following Table:

| No. | Layers below the programming gate | | Advantages | Disadvantages |
|---|---|---|---|---|
| | I2 | I1 | | |
| 1 | $Si_3N_4$ | $SiO_2$ | low tunnel threshold of the $Si_3N_4$ and, therefore, short programming times | $E2/E1$ not particularly large for $F3/F2 = 1$. $\frac{E2}{E1} = \begin{cases} 1.2 \text{ for } \frac{F3}{F2} = 1 \\ 1.9 \text{ for } \frac{F3}{F2} = 2 \\ 2.25 \text{ for } \frac{F3}{F2} = 2.5 \end{cases}$ |
| 2 | $SiO_2$ | $SiO_2$ | technologically simple; good storage behaviour. $\frac{E2}{E1} = 2.1$ for $\frac{F3}{F2} = 1$ and $\frac{d1}{d3} = 0.1$ | high tunnel threshold of the $SiO_2$ in I2. |
| 3 | $SiO_2$ | $Si_3N_4$ | very large $E2/E1$ ratio, low programming voltage $\frac{E2}{E1} = 3.6$ for $\frac{F3}{F2} = 1$ and $\frac{d1}{d3} = 0.1$ | technologically more difficult since $Si_3N_4$ is to be in the programming gate only. High tunnel threshold of the $SiO_2$. |

It can be shown that the factor $(\phi_{ms}+2\phi_F)$ in the read gate threshold voltage $U_T^{(r)}$ can assume inconveniently large values if a relatively large value is chosen for the thickness ratio $d_3/d_2$ of the partial layers I3 and I2 in order to achieve a particularly low programming voltage. To keep the read threshold voltage $U_T^{(r)}$ within tolerable limits in such a case, the material for the read gate will be chosen so that the term $(\phi_{ms}+2\phi_F)$ as the multiplicand remains as small as possible. This is best achieved in n-channel semiconductor storage cells having a p-type substrate by use of tungsten, and in p-channel storage cells according to the invention having an n-type substrate by use of polycrystalline $p^+$-silicon.

The semiconductor storage cell according to the invention is used as a matrix element of a storage cell. The ribbonlike source and drain regions are preferably diffused into a semiconductor substrate introduced into a semiconductor substrate in the form of an island.

What is claimed is:

1. A semiconductor storage cell for nonvolatile electric charge storage, comprising: a ribbonlike source region and a ribbonlike drain region of one conductivity type which are formed in a plane surface of a semiconductor substrate of the other conductivity type, extending parallel to one another, and are interconnected via a channel region above which is disposed a gate insulator layer having an embedded storage medium therein for storing a charge below a gate electrode, that transversely to the source region and the drain region on the gate insulator layer with the embedded storage medium, a ribbonlike programming gate and a ribbonlike read gate are disposed above the channel region and parallel to one another, and that the storage medium below the two gates extends continuously over the entire width of both the read gate and the programming gate, thereby being common to both gates.

2. The semiconductor storage cell as claimed in claim 1, wherein between the source region and the drain region, the storage medium embedded in the gate insulator layer is disposed below the read gate and below the programming gate and extends over a central area of the channel region which area is separated from the source and drain regions by remaining partial areas of the gate insulating layer.

3. The semiconductor storage cell as claimed in claim 2, wherein the central area, the gate insulator layer with the embedded storage medium is thinner than in the remaining partial areas.

4. The semiconductor storage cell as claimed in claim 2 or 3, wherein the gate insulator layer covering the partial areas has a uniform thickness in the range between approximately 700 and 200 Å.

5. The semiconductor storage cell as claimed in claim 2 or 3, wherein the storage medium is embedded between two partial layers of the gate insulator layer, and that partial layer of the gate insulator layer which lies between the storage medium and the semiconductor surface has a uniform thickness in the range between approximately 30 and 300 Å.

6. The semiconductor storage cell as claimed in claims 2 or 3, wherein the thickness of that partial layer of the gate insulator layer which lies between the storage medium and the programming gate is smaller than the thickness of that partial layer of the gate insulator layer which lies between the storage medium and the read gate.

7. The semiconductor storage cell as claimed in claim 6, wherein the partial layer of the gate insulator layer which lies between the storage medium and the programming gate has a thickness in the range between 30 and 400 Å.

8. The semiconductor storage cell as claimed in claim 6, wherein the partial layer of the gate insulator layer which lies between the storage medium and the read gate has a thickness in the range between 400 and 2000 Å.

9. The semiconductor storage cell as claimed in claims 1, 2 or 3, wherein the partial layer of the gate insulator layer which lies between the storage medium and the semiconductor surface is made of a uniform dielectric material.

10. The semiconductor storage cell as claimed in claim 9, wherein the partial layer of the gate insulator layer which lies between the storage medium and the semiconductor surface has a smaller dielectric constant that that of the partial layer laying between the storage medium and the programming gate.

11. The semiconductor storage cell as claimed in claim 10, wherein the partial layer of the gate insulator layer which lies between the storage medium and the semiconductor surface is made of $SiO_2$, while that partial layer of the gate insulator layer which lies between the storage medium and the programming gate is made of $Si_3N_4$, $Al_2O_3$, or $Ta_2O_5$.

12. The semiconductor storage cell as claimed in claims 1, 2 or 3 wherein the section of the area of the storage medium which lies below the programming gate is larger than the section laying below the read gate.

13. The semiconductor storage cell as claimed in claim 12, wherein the ration of that area of the storage medium which lies below the programming gate to the area lying below the read gate is approximately 2:1 to 4:1.

14. The semiconductor storage cell as claimed in claims 1, 2 or 3 wherein the ration of that area of the storage medium which lies below the read gate to the area lying below the programming gate is approximately 1 or greater than 1.

15. The semiconductor storage cell as claimed in claim 14, wherein the ration of the areas lies between 1 and 3.

16. The semiconductor storage cell as claimed in claim 14 wherein all partial layers of the gate insulator layer are made of a chemically uniform material.

17. The semiconductor storage cell as claimed in claim 16, wherein the uniform material is $SiO_2$.

18. The semiconductor storage cell as claimed in claim 14 wherein below the programming gate, the partial layer between the storage medium and the semiconductor surface is made of $Si_3N_4$, $Al_2O_3$ or $Ta_2O_5$, while the partial layer between the storage medium and the programming gate as well as both partial layers below the read gate are made of $SiO_2$.

19. The semiconductor storage cell as claimed in claim 14 wherein the partial layer of the gate insulator layer which lies between the storage medium and the programming gate is made of $Si_3N_4$, while the partial layer between the storage medium and the semiconductor surface is made of $SiO_2$.

20. The semiconductor storage cell as claimed in claim 14 wherein the partial layer of the gate insulator layer which lies between the storage medium and the semiconductor surface is made of a chemically uniform material.

21. The semiconductor storage cell as claimed in any one of claims 1, 2 or 3, wherein the storage medium is a compact layer of a material with low electron work function.

22. The semiconductor storage cell as claimed in any one of claims 1, 2 or 3, wherein the storage medium is a layer of atomically dispersed electron traps whose average spacing lies in the range between 5 and 15 Å.

23. The semiconductor storage cell as claimed in any one of claims 1, 2 or 3, wherein the storage medium is made from a material selected from the group consisting of $n^+$-type polycrystalline silicon, germanium, aluminum arsenide, aluminum antimonide, and gallium arsenide.

24. The semiconductor storage cell as claimed in claim 23, wherein the programming gate is a layer of the same material as that of the storage medium.

25. The semiconductor storage cell as claimed in claim 23, wherein the read gate is a compact layer of the same material as that of the storage medium.

26. The semiconductor storage cell as claimed in claim 1, wherein the partial layer of the gate insulator layer which lies between the storage medium and the semiconductor surface is made of $SiO_2$ and has a thickness in the range between 100 and 200 Å, that the partial layer between the read gate and the storage medium is made essentially of $SiO_2$ and has a thickness in the range between 600 and 133 Å, and that the partial layer between the programming gate and the storage medium has a thickness between 50 and 300 Å.

27. The semiconductor storage cell as claimed in claim 26, wherein the partial layer of the gate insulator layer which lies between the programming gate and the storage medium is made of $Al_2O_3$.

28. The semiconductor storage cell as claimed in claim 26 wherein the partial layer of the gate insulator layer which lies between the programming gate and the storage medium is made of $SiO_2$.

29. The semiconductor storage cell as claimed in claim 26 wherein the partial layer of the gate insulator layer which lies between the programming gate and the storage medium is made of $Si_3N_4$.

30. The semiconductor storage cell as claimed in claims 27, 28 or 29, wherein the storage medium is made, from a material selected from the group consisting of $n^+$-type polycrystalline silicon, $n^+$-type aluminum antimonide, $n^+$-type aluminum arsenide, aluminum, tungsten, or molybdenum.

31. The semiconductor storage cell as claimed in claim 30, wherein the programming gate is made from a material selected from the group consisting of $n^+$-type polycrystalline silicon, aluminum, tungsten, $n^+$-type aluminum arsenide, or $n^+$-type aluminum antimonide.

32. The semiconductor storage cell as claimed in claim 31, wherein the read gate is made from a material selected from the group consisting of n+-type polycrystalline silicon, p+-type polycrystalline silicon, aluminum tungsten, molybdenum, n+-type aluminum arsenide, or n+-type aluminum antimonide.

33. The semiconductor storage cell as claimed in claim 12, wherein by applying a voltage pulse to the programming gate, the threshold voltage below the read gate is subjected to a change of that polarity which the voltage pulse has with respect to the potential of the semiconductor substrate.

34. The semiconductor storage cell as claimed in claim 14, wherein by applying a voltage pulse to the programming gate, the threshold voltage below the read gate is subjected to a change of that polarity which is opposite to the polarity of the voltage pulse with respect to the potential of the semiconductor substrate.

35. The semiconductor storage cell as claimed in claims 1, 2 or 3, wherein the storage medium is made from a material selected from the group consisting of metalls aluminum, gold titanium, magnesium, tantalum, tungsten, molybdenum, thallium molybdenum, thallium either in the form of a compact metallic layer or in the form of a layer atomically dispersed in the gate insulator layer.

* * * * *